United States Patent
Shrivastava et al.

(10) Patent No.: US 12,204,455 B1
(45) Date of Patent: **\*Jan. 21, 2025**

(54) METHOD AND APPARATUS FOR EFFICIENT ADDRESS DECODING AND ADDRESS USAGE REDUCTION

(71) Applicant: Marvell Asia Pte Ltd, Singapore (SG)

(72) Inventors: Saurabh Shrivastava, Saratoga, CA (US); Shrikant Sundaram, San Jose, CA (US); Guy T. Hutchison, Grantown-on-Spey (GB)

(73) Assignee: Marvell Asia Pte Ltd, Singapore (SG)

( * ) Notice: Subject to any disclaimer, the term of this patent is extended or adjusted under 35 U.S.C. 154(b) by 70 days.

This patent is subject to a terminal disclaimer.

(21) Appl. No.: 18/112,931

(22) Filed: Feb. 22, 2023

Related U.S. Application Data (63) Continuation of application No. 16/947,439, filed on Jul. 31, 2020, now Pat. No. 11,609,861.

(60) Provisional application No. 63/007,230, filed on Apr. 8, 2020.

(51) Int. Cl.
*G06F 12/10* (2016.01)
*G06F 12/06* (2006.01)

(52) U.S. Cl.
CPC .......... *G06F 12/10* (2013.01); *G06F 12/0646* (2013.01); *G06F 2212/1044* (2013.01)

(58) Field of Classification Search
CPC ...... G06F 12/0246; G06F 12/00; G06F 12/10; G06F 12/06; G06F 12/0646

USPC .......... 711/E12.001, E12.061, 202, E12.008, 711/100, E12.058
See application file for complete search history.

(56) References Cited

U.S. PATENT DOCUMENTS

| | | | | |
|---|---|---|---|---|
| 2003/0225981 | A1* | 12/2003 | Castelli | G06F 12/1458 711/147 |
| 2004/0225858 | A1* | 11/2004 | Brueggen | G06F 12/0653 711/E12.079 |
| 2009/0073796 | A1* | 3/2009 | Ahsan | G11C 5/02 365/230.06 |
| 2015/0095860 | A1* | 4/2015 | Satou | G06F 30/34 716/103 |
| 2018/0336139 | A1* | 11/2018 | Rao | G11C 16/105 |

\* cited by examiner

*Primary Examiner* — Yaima Rigol
*Assistant Examiner* — Edward Waddy, Jr.

(57) ABSTRACT

A method includes synthesizing a hardware description language (HDL) code into a netlist comprising a first a second and a third components. The method further includes allocating addresses to each component of the netlist. Each allocated address includes assigned addresses and unassigned addresses. An internal address space for a chip is formed based on the allocated addresses. The internal address space includes assigned addresses followed by unassigned addresses for the first component concatenated to the assigned addresses followed by unassigned addresses for the second component concatenated to the assigned addresses followed by unassigned addresses for the third component. An external address space for components outside of the chip is generated that includes only the assigned addresses of the first component concatenated to the assigned addresses of the second component concatenated to the assigned addresses of the third component. Internal addresses are translated to external addresses and vice versa.

21 Claims, 6 Drawing Sheets

METHOD AND APPARATUS FOR EFFICIENT ADDRESS DECODING AND ADDRESS USAGE REDUCTION

CROSS-REFERENCE TO RELATED APPLICATIONS

This application is a continuation application and claims the benefit to the U.S. application Ser. No. 16/947,439, filed on Jul. 31, 2020, which claims the benefit and priority to the U.S. Provisional Patent Application No. 63/007,230, filed Apr. 8, 2020, which are incorporated herein in their entirety by reference.

BACKGROUND

Hardware chips have become larger and more complex in recent years with various storage units including but not limited to one or more of memories, registers, decoders, rings, blocks, etc., distributed throughout each hardware chip. Memory addresses are allocated to these storage units in order for the storage units to be accessible. Unfortunately, even a small incremental allocation of addresses may require a complex or heavy decoding scheme, resulting in inefficiencies and overly blown address usage which uses big chunk of total system addresses.

The foregoing examples of the related art and limitations related therewith are intended to be illustrative and not exclusive. Other limitations of the related art will become apparent upon a reading of the specification and a study of the drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein. It should also be understood that the terminology used herein is for the purpose of describing the certain concepts and the terminology is not intended to be limiting. Unless defined otherwise, all technical and scientific terms used herein have the same meaning as commonly understood in the art to which the embodiments pertain.

Many hardware architectures are written in hardware description language (HDL) codes such as Verilog, which is subsequently synthesized. During synthesis, the code is converted into a netlist of components, e.g., memories, registers, blocks/slaves, decoders, rings, etc. The components are then placed and routed.

In some nonlimiting examples, the components may be placed and routed in a hierarchical structure and each component may have other components underneath it. For example, a decoder may have other decoders, rings, etc., underneath it. Similarly, rings may have multiple blocks underneath it. It is appreciated that rings are used for connecting components while decoders are used for configuring the blocks and to enable communication between one block with another node, e.g., another block of memories, etc. It is appreciated that in some embodiments, a block may have multiple registers and memories underneath it.

It is appreciated that the components are allocated addresses in order for them to be accessible and in order for them to be able to communicate with other components. For example, registers and memories within a given block are allocated addresses in order for them to be accessible. Similarly, blocks and registers, decoders, rings, etc., are allocated addresses as well. In general, a block by block address allocation is employed from the lowest hierarchical level to the highest. For example, all registers and memories within a given block are assigned addresses. However, the block that contains the registers and memories is allocated addresses that is the next power of 2. For example, if 345 addresses are assigned to registers and memories within a given block, then 512 addresses are allocated to the block, which is the next power of 2 that is $2^9$. As a result, a series of addresses allocated to a block is unassigned to actual registers and memories, in this example, 512−345=167 addresses, creating a gap of addresses that are not used.

The process continues for each block from the lowest level of the hierarchy until it reaches the highest level of the hierarchy. It is appreciated that blocks or components within the same hierarchical level (i.e. connected to the same component at a higher hierarchical node) are added together and rounded off to the next power of 2 for the component at the higher hierarchical node. As more and more addresses are being allocated and assigned and as the process moves to higher levels of the hierarchical structure, the gap of unused (also referred to as unassigned) addresses grows bigger. For illustrative purposes, it is presumed that the block allocated $2^9$ addresses and another block within a same hierarchical level that are both being decoded by the same decoder is allocated a block of $2^{20}$. The address allocation for the decoder is then $2^9+2^{20}$ rounded off to the next power of 2 which is $2^{21}$. However, the assigned addresses for the decoder is approximately $2^{20}$ in magnitude leaving approximately $2^{20}$ addresses unused/unassigned. As illustrated, the address allocation scheme results in large blocks of address space not being used or assigned, resulting in complex address decoding for an external unit accessing the chip. Accordingly, a need has arisen to compress the address space to be used by an external component to the chip and to reduce the complexity of the decoding scheme.

A new approach of systems and methods to efficient address decoding and address usage reduction is proposed. In some embodiments, a translation module is generated during synthesis to determine the boundaries between addresses of all components and structures within a chip. Since the translation module has visibility into the allocated addresses, it can remove the unassigned/unused addresses within each block and shift the assigned addresses in order to compress the address space. In other words, since the translation module is aware and/or has knowledge of the internal allocated addresses, it can remove the unassigned/unused addresses within each block and shift the assigned addresses in order to compress the address space when being accessed by an external component. It is appreciated that the compressed address space is the external address space that only includes the assigned addresses to the components and where the unassigned addresses have been removed. As such, instead of having gaps of addresses as big as $2^{20}$, the external address space that is visible to an external unit or device is only the assigned addresses one after another without gaps in between. In other words, the addresses for the external address space are listed in a chronological order and each entry is an assigned address within the chip. The translation module having visibility to the internal address space that includes the gaps and also having created the external address space can translate and map an address from the external address space to the internal address space and vice versa. For example, the translation module is configured to translate an address received from a component/unit off chip (i.e. component/unit external to the chip) and to also translate an address that is being transmitted to a component/unit off chip. It is appreciated that use of the translation module results in reduction of address usage external to the chip, freeing up more address space to be used by other components, unit, chips, etc.

Figure 1:
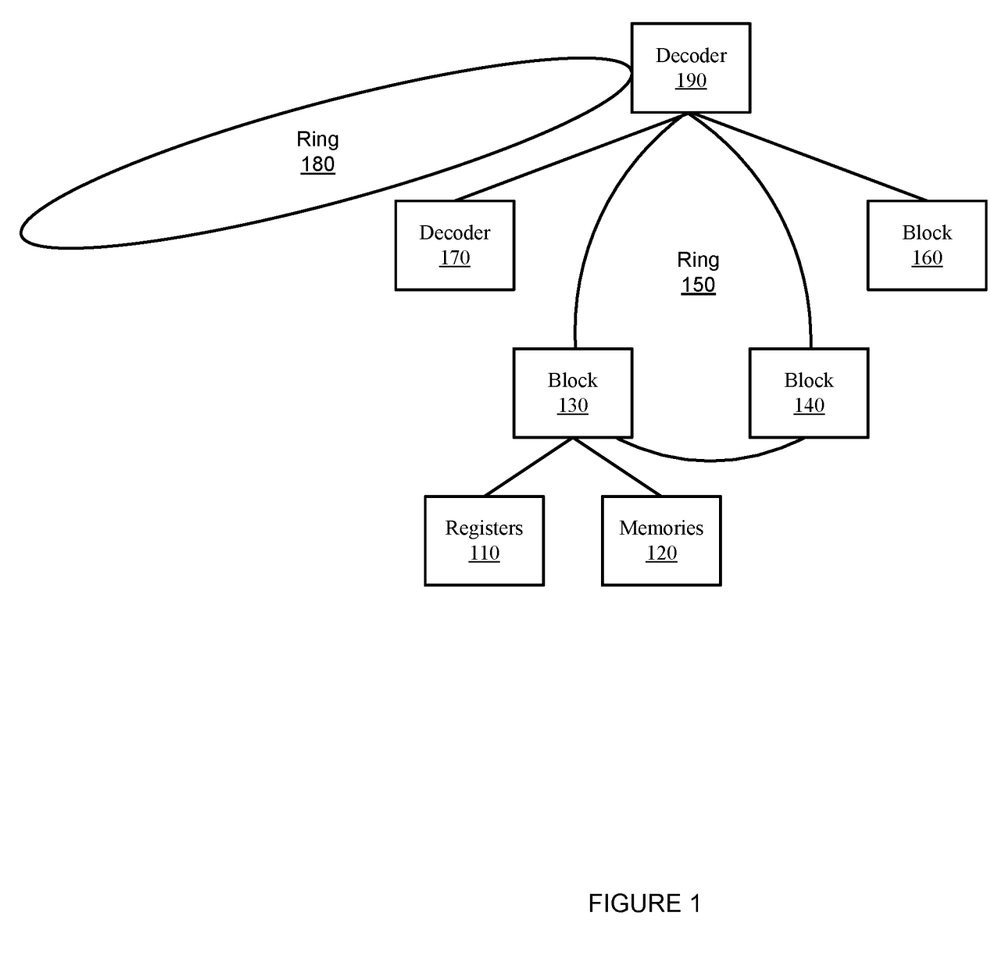
FIG. 1 depicts an example of a diagram of a hardware-based architecture after a hardware description language (HDL) synthesis according to one aspect of the present embodiments.

FIG. 1 depicts a diagram of an example of a hardware-based architecture after an HDL synthesis according to one aspect of the present embodiments. Once an HDL code such as a Verilog code is synthesized, a netlist including components such as memories, registers, blocks/slaves, decoders, rings, etc., may be generated. The netlist is placed and routed. In some nonlimiting examples, a hierarchical structure is formed. For example, the lowest level of the hierarchical structure includes registers 110 and memories 120 underneath the block 130. Block 130 is within the same hierarchical tier as block 140 in this nonlimiting example. For illustrative purposes, blocks 130 and 140 are connected to a node positioned higher in the hierarchical structure, e.g., ring 150. The ring 150 may be within the same hierarchical tier as block 160, decoder 170, and ring 180, all of which may be connected to the decoder 190 at the top of the hierarchical structure. It is appreciated that ring 180 may connect various components (not shown here) to the decoder 190.

It is appreciated that the address allocation starts with registers 110 and memories 120 that are positioned at the lowest tier of the hierarchical structure. The registers 110 and the memories 120 are assigned addresses. The block 130 is the sum of the addresses for the registers 110 and the memories 120 rounded to the next power of 2. As the example presented above, if 345 addresses are assigned, then block 130 is allocated $2^9$ or 512 addresses. Similarly, block 140 is assigned addresses and addresses are allocated, e.g., $2^{20}$, as an example. Therefore, in order to allocate addresses to the next tier, common node between blocks 130 and 140, the allocated addresses for the blocks 130 and 140 are added and rounded to the next power of 2 (i.e. $2^9+2^{20}$ rounded to the next power of 2, which is $2^{21}$). It is appreciated the process is repeated for each component, hence block 160, decoder 170, ring 180, decoder 190, etc. until every component within the netlist is allocated addresses that includes assigned and unassigned addressed. In this example, block 130 includes 345 assigned addresses and 167 unassigned addresses with a total of 512 allocated addresses.

Figure 2A:
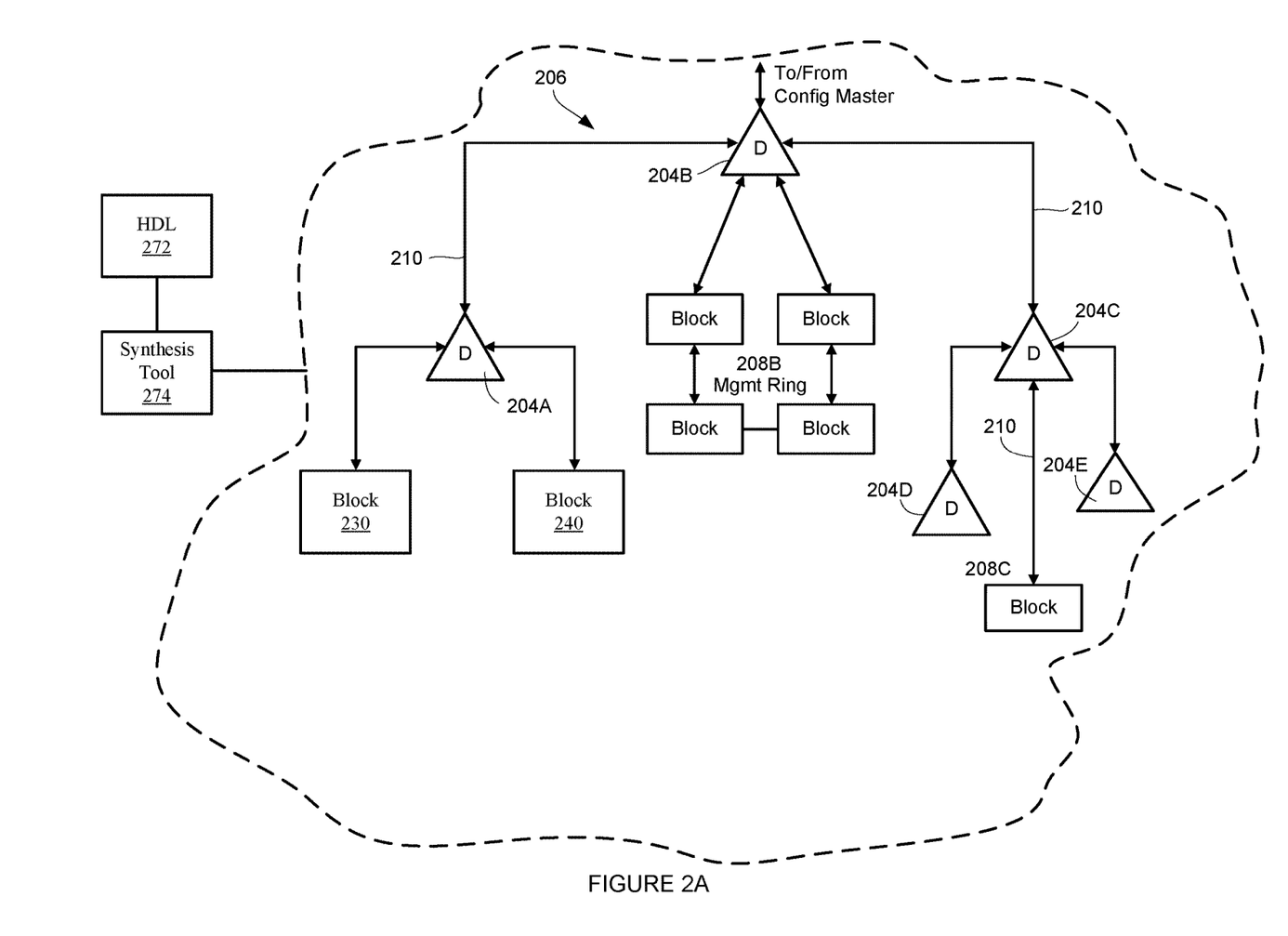
FIGS. 2A-2B depict nonlimiting examples of a diagram of a hardware-based architecture synthesized from an HDL and address assignments according to one aspect of the present embodiments.

FIG. 2A depicts an example of a diagram of a hardware-based architecture synthesized from an HDL according to one aspect of the present embodiments. Although the diagrams depict components as functionally separate, such depiction is merely for illustrative purposes. It will be apparent that the components portrayed in this figure can be arbitrarily combined or divided into separate software, firmware and/or hardware components. Furthermore, it will also be apparent that such components, regardless of how they are combined or divided, can execute on the same host or multiple hosts, and wherein the multiple hosts can be connected by one or more networks.

In the example of FIG. 2A, a piece of HDL code 272 may be synthesized with the synthesis tool 274. The HDL code may be a Verilog code. Once synthesized, a netlist is generated and the components of the netlist are placed and routed. For a nonlimiting example, in some embodiments, a central/master functional unit, which can be but is not limited to a plurality of address decoders 204A, 204B, 204C, 204D, and 204E (each represented by "D") arranged in a multi-level hierarchy 206, e.g., a tree-like structure, and a plurality of functional units/blocks/slaves, which can be but are not limited to, blocks 208B and 208C, each attached to one decoder of the plurality of address decoders 204B, and 204C respectively, wherein each block 208B, and 208C is a register module associated with or inside a type of functional block (not shown) in a chip. It is appreciated that the blocks 230 and 240 may each be a functional component attached to the address decoder 204A. The architecture further includes a plurality of bi-directional linkages/interconnects 210s that connect various components of the architecture together. It is appreciated that the embodiments are described with respect to interrupts and interrupt handlers for illustrative purposes and should not be construed as limiting the scope of the embodiments. For example, the embodiments are equally applicable to a core with various blocks and memory units, e.g., flash storage, etc. or it may be a Redundant Array of Independent Disks (RAID) system. Accordingly, the description with respect to interrupt handlers is for illustrative purposes and should not be construed as limiting the scope of the embodiments. Each of these components in the architecture is a dedicated hardware block/component programmable by a user at a host (not shown) via software instructions for various operations. When the software instructions are executed, each of the hardware components becomes a special purposed hardware component for practicing certain machine learning functions. In some embodiments, the architecture is on a single chip, e.g., a system-on-chip (SOC).

In some embodiments, the address decoders 204A-204E, and the blocks 208B-C function as register access interfaces configured to access the registers (not shown) in these components to write data and/or control information into or read data and/or control information from certain addresses of the registers in these components, respectively.

In the example of FIG. 2A, each block 208B-C includes a register module configured to implement a set of register functionalities associated with the functional blocks in the chip. Here, the functional block of each of the blocks 208B-208C can be, but is not limited to, one of a PCIe block for interfacing communication between an external host and the chip, an Ethernet memory block for handling and storing Ethernet communications with the chip, a SBus block for transmitting address, data, and control information over a bus in the chip. etc.

As shown in FIG. 2A, each address decoder 204A-E serves as an intermediate node in the multi-level hierarchy 206 and is associated with one or more blocks 208B-C, blocks 230-240, and/or one or more other address decoders 204A-E. In some embodiments, each address decoder 204A-E is configured to accept data packet from the associated one or more blocks 208B-C, blocks 230-240, and/or other address decoders 204A-E, decode a destination address of the packet, and forward the packet to the configuration master or the next address decoder 204A-E in the multi-level hierarchy 206 based on the decoded destination address. Conversely, a response packet is generated and received, the address decoders 208A-C are configured to accept the response packet, decode the destination address of the response packet, and forward the response packet to the block 208B-C or blocks 230-240 or the next address decoder 204A-E in the multi-level hierarchy 206. Once the block 208B-C or blocks 230-240 accepts the response packet, the functional block associated with the block 208B-C or blocks 230-240 may then be configured or adjusted according to the response packet received.

Figure 2B:
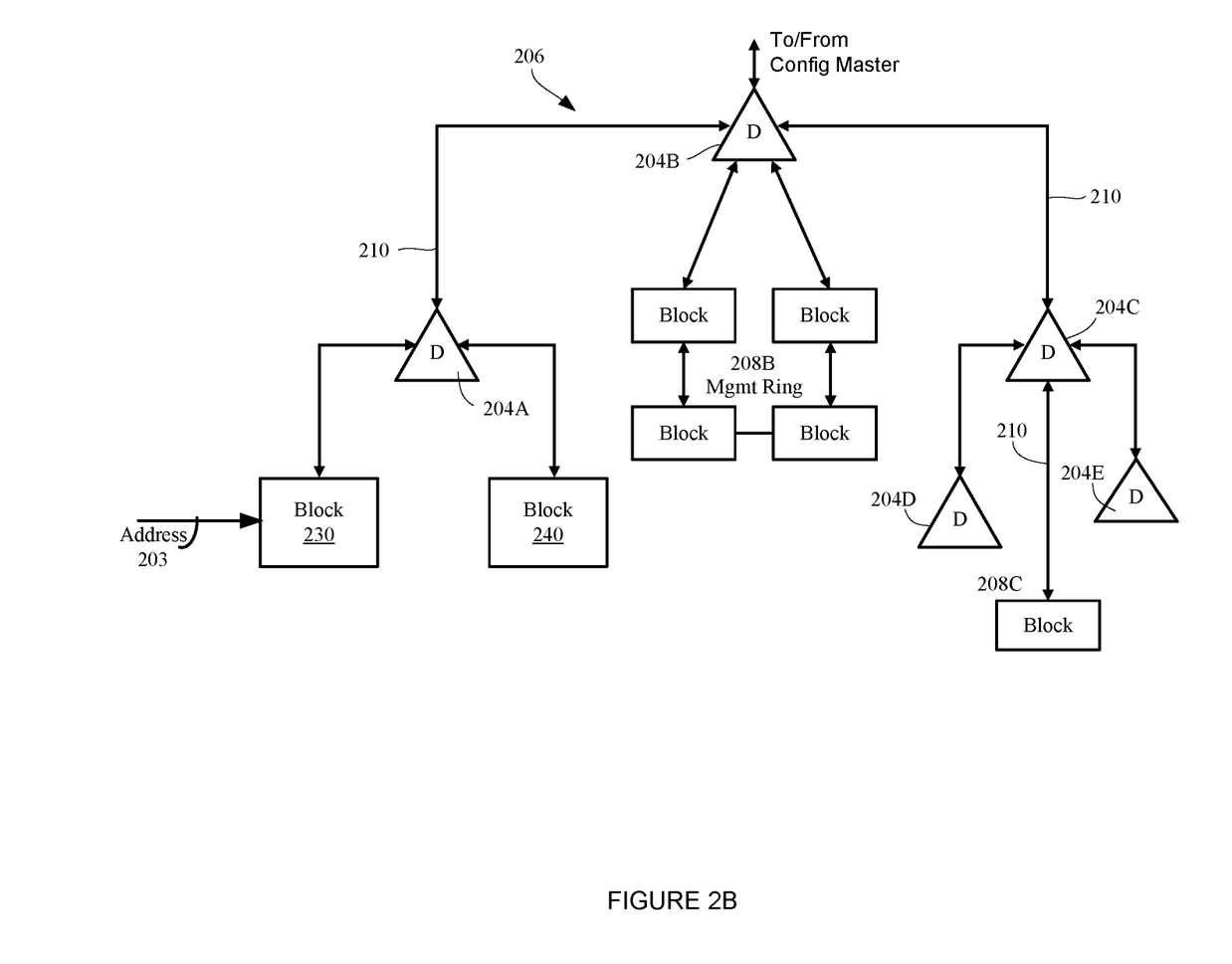

Referring now to FIG. 2B, address assignment and allocation to the components of the netlist according to some embodiments are shown. During synthesis addresses are assigned and allocated to each component of the netlist. For example, address 203 may be assigned to block 230, which are at the lowest hierarchical level. In this nonlimiting example, addresses 1 through 345 is assigned. Accordingly, block 230 is allocated the next power of 2 for the assigned addresses, hence $2^9$ or 512 addresses. Thus, 167 addresses are unassigned for the allocated addresses to the block 230.

According to some embodiments, block 240 that is within the same hierarchical level as block 230 and are both connected to the same decoder 204A, is also assigned addresses in a similar fashion to block 230. Moreover, block 240 is allocated addresses similar to block 230. It is appreciated that address allocation to decoders, rings, blocks, registers and memories is done in a hierarchical fashion, as described. In this nonlimiting example and for illustrative purposes block 240 is allocated $2^{20}$ addresses. As an example, out of the $2^{20}$ addresses somewhere between 524288 and 1048576 addresses are assigned leaving the rest as unassigned. Since blocks 230 and 240 are within the same hierarchical level and are connected to the same decoder 204A positioned at the next hierarchical level, the allocated addresses of the two blocks are added and rounded to the next power of 2, hence $2^{21}$. Even assuming that block 240 utilizes most of the allocated addresses as assigned addresses, e.g., maximum of 1048576, and block 230 using 345 addresses, that leaves the decoder 204A with 1048231 unassigned addresses. As illustrated, the number of unassigned addresses increases as traveling higher up the hierarchical structure. A sample Verilog code for assigning addresses is shown below.

```
casez (address)
    30'b0000000zzzzzzzzzzzzzzzzzzzzzzz rsel=1;// ring0
    30'b000000100000zzzzzzzzzzzzzzzzz     rsel=2;//
        decoder0
    30'b0000000100001000zzzzzzzzzzzzz rsel=4;// ddr
        ring0
    30'b00000001000010010zzzzzzzzzzzz rsel=8;//local
        ring0
    30'b00000001000010010100zzzzzzzzz rsel=16;// xyz
        ring0
    30'b000000010000100101000zzzzzzz     rsel=32;//
        misc ring0
    30'b000000010000100101010010zzzzzz     rsel=64;//
        block0
    30'b000000010000100101010011zzzzzz     rsel=128;//
        block1
    default: rsel=256;
endcase
```

Figure 3:
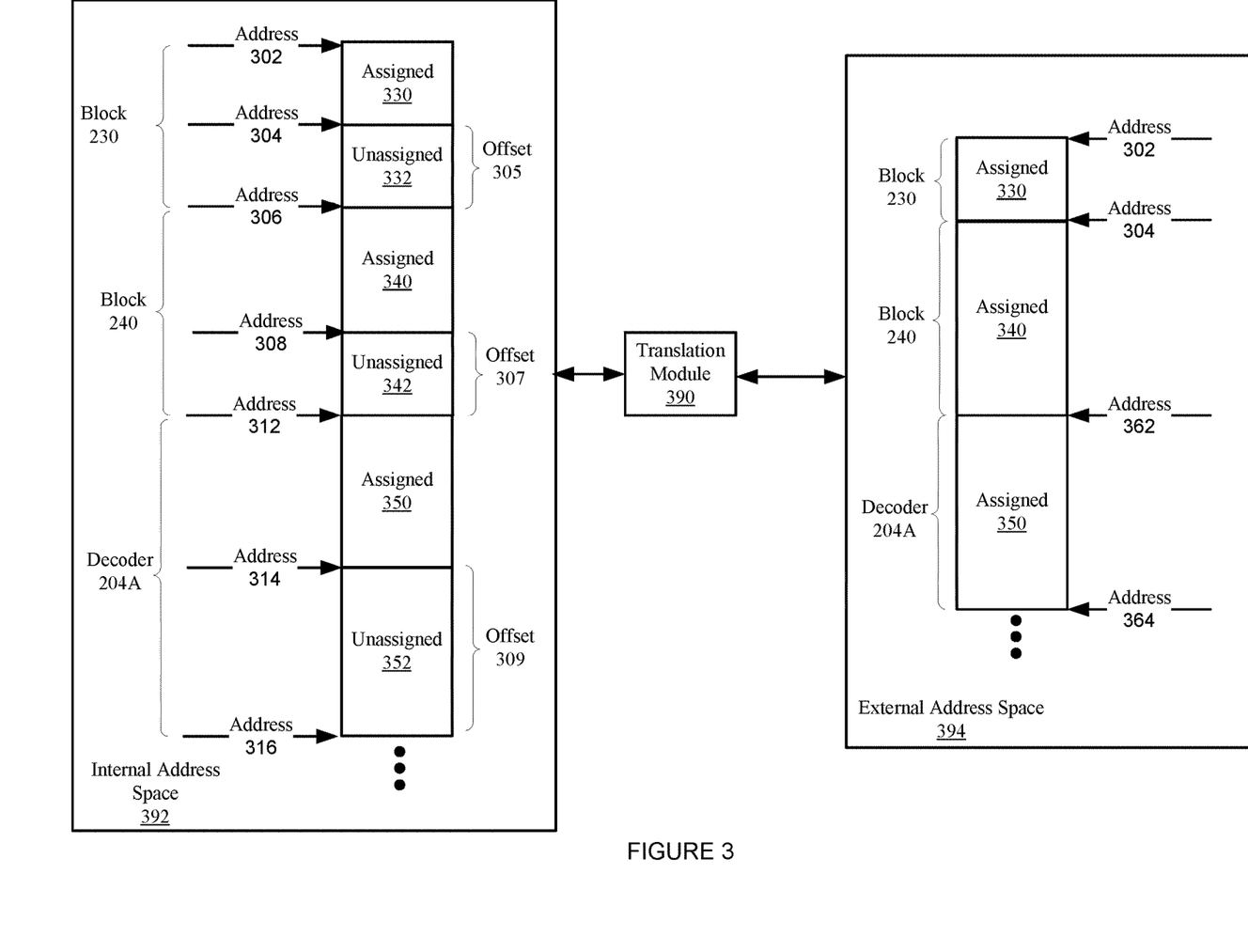
FIG. 3 depicts a nonlimiting example for generating a translation module for translating addresses between internal address space and an external address space according to one aspect of the present embodiments.

It is appreciated that address rounding and address allocation is done for registers, memories, blocks/slaves, decoders, rings, etc. In order to eliminate the number of addresses (i.e. unassigned address) to environment outside of the chip, a translation module is generated. FIG. 3 depicts a nonlimiting example for generating a translation module 390 for translating addresses between internal address space 392 and external address space 394, according to one aspect of the present embodiments. The translation module 392 is generated during synthesis and is on the same database or has access to the same database with internal addresses, according to some nonlimiting example. Accordingly, the translation module 390 is aware and has knowledge of the address boundaries between different components and structures of the chip and as such it can translate and map the internal addresses stored in an internal address space to addresses outside of the chip (the external address space is visible to external components) and vice versa. The internal address space 392 is generated as described above with respect to FIGS. 1-2B.

In one nonlimiting example, the internal address space 392 includes address allocation to blocks 230, 240, decoder 204A, etc. In this nonlimiting example, the internal address space 392 includes assigned addresses 330 for block 230 starting at address 302, unassigned addresses 332 for block 230 that starts at address 304. The internal address space 392 further includes assigned addresses 340 for block 240 starting at address 306, unassigned addresses 342 for block 240 that starts at address 308. As illustrated, addresses for blocks 230 and 240 are in chronological order and follow one another. In other words, the last entry of the unassigned 332 addresses of block 230 is immediately preceding the first entry of the assigned address 340 of block 240. Similarly, the internal address space 392 further includes assigned addresses 350 for decoder 204A starting at address 312, unassigned addresses 352 for the decoder 204A that starts at address 314. It is appreciated that as illustrated the addresses for the decoder 204A are chronologically after block 240. In other words, the last entry of the unassigned 342 addresses of block 240 is immediately preceding the first entry of the assigned addresses 350 of the decoder 204A. It is appreciated that this process is repeated for all components of the netlist that include all structures within the chip. For example, addresses associated with other components start at address 316 and the process is repeated. As illustrated, an offset is created between the assigned addresses. For example, offset 305 associated with unassigned addresses 332 creates a gap between the assigned 330 addresses of the block 230 and the assigned 340 address of block 240. Similarly, offset 307 associated with unassigned addresses 342 creates a gap between the assigned 340 addresses of block 240 and the assigned 350 addresses of the decoder 204A. Similarly, offset 309 creates a gap between the assigned 350 addresses of the decoder 204A and other assigned addresses of structures within the same chip.

In some embodiments, the created translation module 390 determines the address boundaries between any two structures of the internal address space 392. Accordingly, the gaps between the assigned addresses can be removed to form concatenated assigned addresses for all structures within the chip, hence forming a compressed address for components/units external to the chip. For example, the unassigned 332, 342, and 352 addresses associated with blocks 230, 240 and decoder 204A having the offsets 305, 307, and 309 are removed when the external address space 394 is generated. In this nonlimiting example, in the external address space 394, the assigned 330 address starts at address 302, however, at address 304 instead of pointing to the first entry of the unassigned 332 addresses (as it is in internal address space 392), the address 304 points to the first entry of the assigned 340 addresses that is associated with block 240. The rest of the assigned addresses for block 240 follow.

Similarly, other gaps corresponding to unassigned addresses and offsets are removed and the addresses are shifted accordingly in the external address space 394. In this nonlimiting example, the unassigned 342 addresses from the internal address space 392 are removed when forming the external address space 394. As such, the external address space 394, when formed, includes the assigned 350 addresses where its first entry starts at address 362 immediately following the last entry of the assigned 340 addresses. In other words, the address of the last entry for each assigned component is immediately followed by a first entry (i.e. assigned address) of another component of the hierarchical structure. The process continues and other unassigned addresses are removed. For example, unassigned 352 addresses are also removed and the first entry of the next assigned addresses of the next component starts at address 364. In other words, the assigned addresses for each component of the hierarchical structure are followed by assigned addresses of other components in the hierarchical structure and concatenated to one another in chronological order. It is appreciated that concatenated addresses and chronological ordering of the addresses in the external address space 394 refers to the contiguous address locations. As such, the external address space 394 is generated that is a compressed version of the internal address space 392 since the unassigned addresses are removed and the remainder of the assigned addresses are shifted.

In some embodiments, the translation module 390 is used to translate and map internal addresses to external addresses through the use of the internal address space 392 and the external address space 394. Units and components outside of the chip have access to the external address space 394, which is compressed in comparison to the internal address space 392, thereby freeing up unassigned addresses to be used by other components external to the chip.

Figure 4:
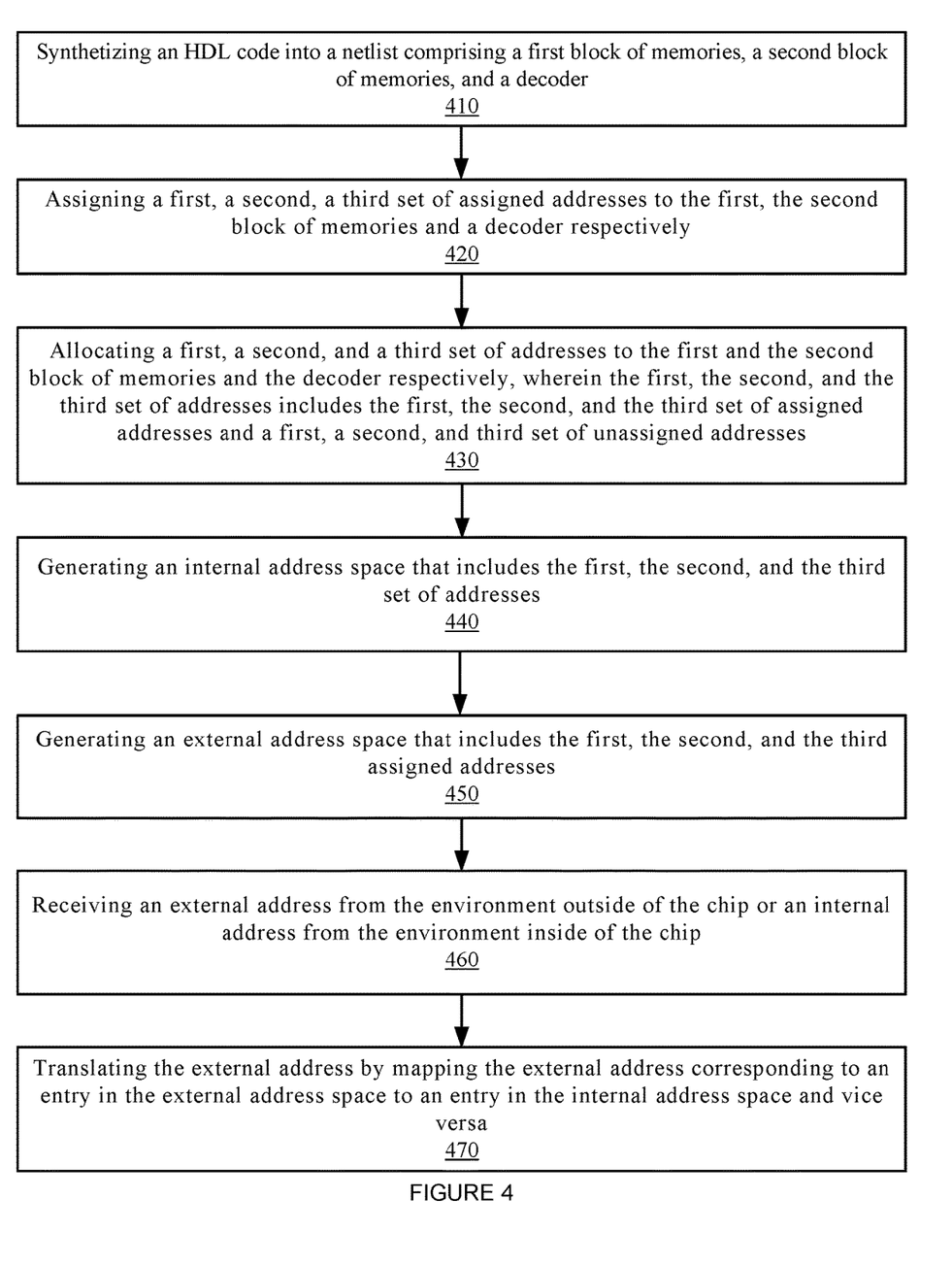
FIG. 4 depicts a flowchart of an example of a process to generate a translation module for translating addresses between an internal address space and an external address space according to one aspect of the present embodiments.

FIG. 4 depicts a flowchart of an example of a process to generate a translation module for translating addresses between an internal address space and an external address space according to one aspect of the present embodiments. At step 410, an HDL code is synthesized into a netlist comprising a first block of memories, a second block of memories, and a decoder, as described above with respect to FIGS. 1-2B. At step 420, a first, a second, and a third set of addresses are assigned to the first block of memories, the second block of memories, and the decoder respectively. At step 430, a first set of addresses, a second set of addresses, and a third set of addresses are allocated to the first block of memories, the second block of memories, and the decoder respectively, as described above in FIGS. 1-2B. It is appreciated that the allocated addresses each includes assigned addresses as well as unassigned addresses. It is appreciated that addresses for other components may similarly be assigned and allocated.

At step 440, an internal address space is generated for the first, the second, and third set of addresses, as described above, for example FIG. 3. Similarly, a translation module may be generated such that external address space is formed at step 450, as described in FIG. 3. The external address space may include the first, the second, and the third assigned addresses. It is appreciated that the last entry of the first assigned addresses immediately precedes a first entry of the second set of assigned addresses. Moreover, the last entry of the second set of assigned addresses immediately precedes a first entry of the third assigned addresses. It is appreciated that the internal address space and allocation thereof may be invisible to environment outside of the chip whereas the external address space is visible to the environment outside of the chip.

At step 460, an external address from the environment outside of the chip is received by the chip or alternatively an internal address from the environment inside of the chip is received to be sent outside of the chip. At step 470, the received address (i.e. internal address or external address) is translated based on the mapping between the internal address space and the external address space. For example, the internal address is translated to an address in the external address space and vice versa.

Figure 5:
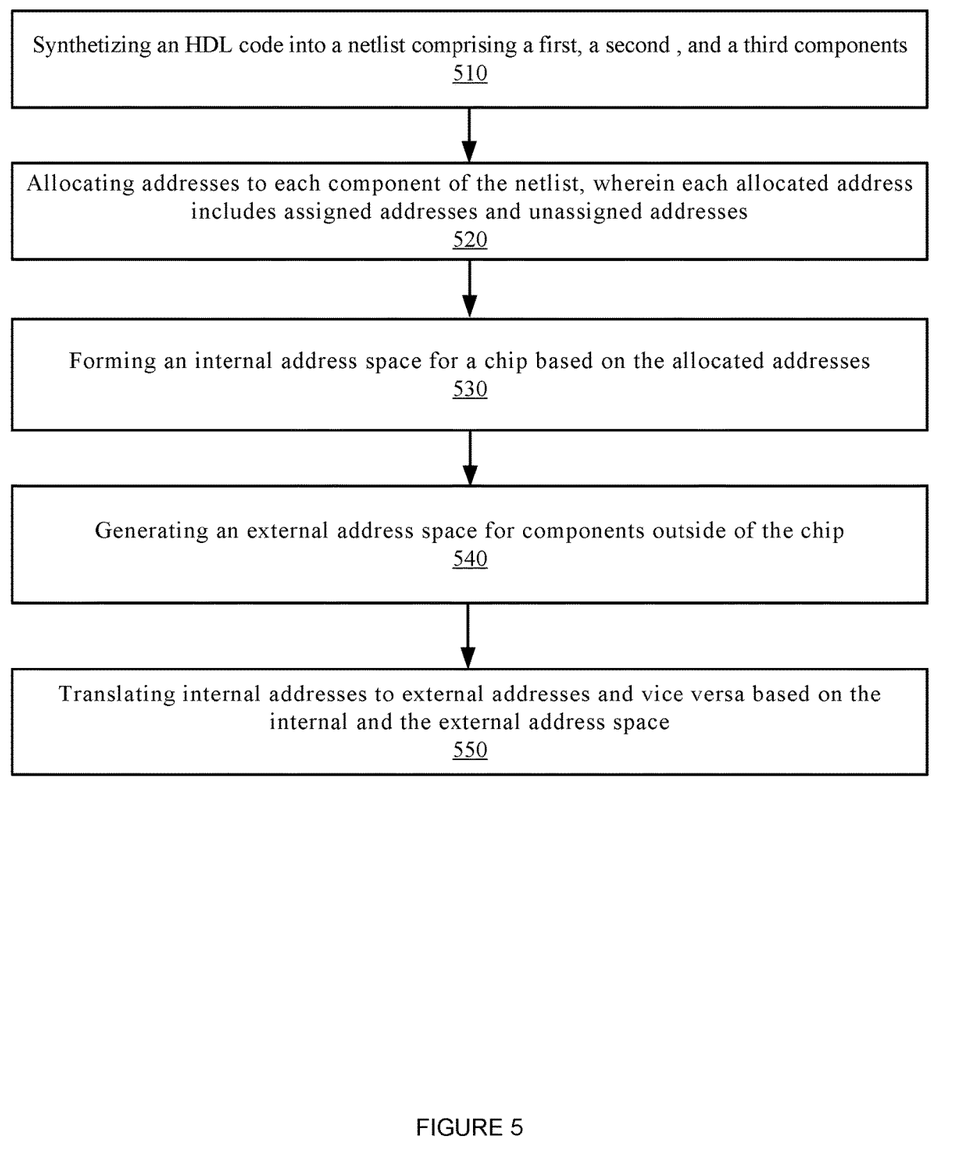
FIG. 5 depicts a flowchart of a nonlimiting example of a process to generate a translation module for translating addresses between an internal address space and an external address space according to one aspect of the present embodiments.

FIG. 5 depicts a flowchart of a nonlimiting example of a process to generate a translation module for translating addresses between an internal address space and an external address space according to one aspect of the present embodiments. At step 510, an HDL code is synthesized into a netlist comprising of a first, a second, and a third components, as presented above in FIGS. 1-2B. Addresses are allocated to each component of the netlist, at step 520. It is appreciated that each allocated address includes assigned addresses and unassigned addresses, as presented above. At step 530, an internal address space if formed for a chip based on the allocated addresses, as described in FIGS. 2A and 3. The internal address space may include assigned addresses followed by unassigned addresses for the first component concatenated to the assigned addresses followed by unassigned addresses for the second component concatenated to the assigned addresses followed by unassigned addresses for the third component.

At step 540, an external address space is generated for components outside of the chip, as described in FIG. 3. The external address space includes only the assigned addresses of the first component concatenated to the assigned addresses of the second component concatenated to the assigned addresses of the third component. In other words, the external address space forms a contiguous address locations. At step 550, internal addresses are translated to external addresses and vice versa based on the internal and external address space, as described in FIG. 3. As such, an address received from a component off the chip can be translated to an address within the internal address space and vice versa. It is appreciated that the external address space is a compressed version of the internal address space by removing the unassigned addresses.

It is appreciated that in some embodiments, the external address space is formed by determining address boundary between allocated addresses for each component of the netlist. Unassigned addresses of the first, the second, and the third components are removed. The external address space may be generated for the assigned addresses of the second and the third components. It is appreciated that the generated external addresses are shifted addresses after the unassigned addresses of the first, the second, and the third components are removed. The external address space includes the assigned addresses for the first component immediately followed by the generated external addresses.

According to one nonlimiting example, generating the external address space includes shifting the assigned addresses of the second component to start at the unassigned addresses of the first component opening additional addresses to the unassigned addresses of the second component. Moreover, generating the external address space includes shifting the assigned addresses of the third component to start immediately after the assigned addresses of the second component. It is appreciated that additional addresses after a last entry of the assigned addresses of the third component is removed after the assigned addresses of the third component is shifted.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Embodiments were chosen and described in order to best describe the principles of the invention and its practical application, thereby enabling others skilled in the relevant art to understand the claimed subject matter, the various embodiments and the various modifications that are suited to the particular use contemplated.

What is claimed is:

1. A method comprising:
    creating a netlist comprising a first a second and a third components, wherein a component is one of a memory, register, block/slave, decoder, or ring;
    allocating addresses to each component of the netlist, wherein each allocated address includes one or more assigned addresses and unassigned addresses;
    forming an internal address space for a chip based on the allocated addresses, wherein the internal address space includes one or more of a first allocated address, a second allocated address, and a third allocated address, wherein the first allocated address is associated with the first component, wherein the second allocated address is associated with the second component, and wherein the third allocated address is associated with the third component;
    generating an external address space for components outside of the chip that includes only the assigned addresses of one or more the first component, the second component, and the third component; and
    translating internal addresses to external addresses and vice versa based on the internal and the external address space.

2. The method of claim 1 further comprising compressing the internal address space to form the external address space.

3. The method of claim 2, wherein the compressing comprises:
    determining address boundary between allocated addresses for each component of the netlist;
    removing unassigned addresses of the first, the second, and the third components; and
    generating external addresses for the assigned addresses of the second and the third components, wherein the generated external addresses are shifted addresses after the unassigned addresses of the first, the second, and the third components are removed, and wherein the external address space includes the assigned addresses for the first component immediately followed by the generated external addresses.

4. The method of claim 1 wherein the generating external address space comprises:
    shifting the assigned addresses of the second component to start at the unassigned addresses of the first component opening additional addresses to the unassigned addresses of the second component;
    shifting the assigned addresses of the third component to start immediately after the assigned addresses of the second component; and
    removing additional addresses after a last entry of the assigned addresses of the third component after the assigned addresses of the third component is shifted.

5. The method of claim 1, wherein the external address space includes the assigned addresses of the first component wherein a last entry of the assigned addresses of the first component is immediately followed by a first entry of the assigned addresses of the second component and wherein a last entry of the assigned addresses of the second component is immediately followed by a first entry of the assigned addresses of the third component.

6. The method of claim 1, wherein the rings are configured to provide connectivity to memories, blocks/slave, or decoders.

7. The method of claim 1, wherein the decoders are configured to decode addresses for different components.

8. The method of claim 1, wherein the allocating includes rounding off by a next power of 2 for each component after assigning addresses.

9. The method of claim 1, wherein the translating occurs in response to transmitting an internal address to a location external to the chip.

10. The method of claim 1, wherein the translating occurs in response to receiving an external address from a location external to the chip.

11. The method of claim 1, wherein the external address space is visible to components external to the chip, and wherein the internal address space is invisible to the components external to the chip.

12. The method of claim 1, wherein the creating the netlist includes synthesizing a hardware description language (HDL) code.

13. A system comprising:
    a first component, wherein the first component is one of a memory, register, block/slave, decoder, or ring, wherein the first component is allocated a first set of addresses, wherein the first set of addresses includes assigned and unassigned addresses;

a second component, wherein the second component is one of a memory, register, block/slave, decoder, or ring, wherein the second component is allocated a second set of addresses, wherein the second set of addresses includes assigned and unassigned addresses;

a third component, wherein the third component is one of a memory, register, block/slave, decoder, or ring, wherein the third component is allocated a third set of addresses, wherein the third set of addresses includes assigned and unassigned addresses; and a translation module configured to form an internal address space for a chip based on the allocated addresses, wherein the internal address space includes one or more of a first allocated address, a second allocated address, and a third allocated address, wherein the first allocated address is associated with the first component, wherein the second allocated address is associated with the second component, and wherein the third allocated address is associated with the third component, and wherein the translation module is further configured to generate an external address space for components outside of the chip that includes only the assigned addresses of one or more the first component, the second component, and the third component, and wherein the translation module is configured to translate internal addresses to external addresses and vice versa based on the internal and the external address space.

14. The system of claim 13, wherein the translation module is configured to compress the internal address space to form the external address space.

15. The system of claim 14, wherein the translation module is configured to:

determine address boundary between allocated addresses for each component;

remove unassigned addresses of the first, the second, and the third components; and generate external addresses for the assigned addresses of the second and the third components, wherein the generated external addresses are shifted addresses after the unassigned addresses of the first, the second, and the third components are removed, and wherein the external address space includes the assigned addresses for the first component immediately followed by the generated external addresses.

16. The system of claim 13 wherein the translation module is configured to:

shift the assigned addresses of the second component to start at the unassigned addresses of the first component opening additional addresses to the unassigned addresses of the second component;

shift the assigned addresses of the third component to start immediately after the assigned addresses of the second component; and remove additional addresses after a last entry of the assigned addresses of the third component after the assigned addresses of the third component is shifted.

17. The system of claim 13, wherein the external address space includes the assigned addresses of the first component wherein a last entry of the assigned addresses of the first component is immediately followed by a first entry of the assigned addresses of the second component and wherein a last entry of the assigned addresses of the second component is immediately followed by a first entry of the assigned addresses of the third component.

18. The system of claim 13, wherein the allocated addresses is a number of assigned addresses rounded off by a next power of 2 for each component.

19. The system of claim 13, wherein the translation module is configured to translate an internal address to an external address when transmitted to a location external to the chip and wherein an external address is translated to an internal address when an address is received from a location external to the chip.

20. The system of claim 13, wherein the external address space is visible to components external to the chip, and wherein the internal address space is invisible to the components external to the chip.

21. A system comprising:

a means for creating a netlist comprising a first a second and a third components, wherein a component is one of a memory, register, block/slave, decoder, or ring;

a means for allocating addresses to each component of the netlist, wherein each allocated address includes one or more assigned addresses and unassigned addresses;

a means for forming an internal address space for a chip based on the allocated addresses, wherein the internal address space includes one or more of a first allocated address, a second allocated address, and a third allocated address, wherein the first allocated address is associated with the first component, wherein the second allocated address is associated with the second component, and wherein the third allocated address is associated with the third component;

a means for generating an external address space for components outside of the chip that includes only the assigned addresses of one or more the first component, the second component, and the third component; and a means for translating internal addresses to external addresses and vice versa based on the internal and the external address space.

* * * * *